United States Patent

Ester

[15] 3,665,369

[45] May 23, 1972

[54] MOUNTING DEVICE FOR PRINTED WIRING BOARDS

[72] Inventor: Charles E. Ester, Glendale, Ariz.

[73] Assignee: Honeywell Information Systems INc.

[22] Filed: June 10, 1970

[21] Appl. No.: 44,941

Related U.S. Application Data

[62] Division of Ser. No. 693,599, Dec. 26, 1967, Pat. No. 3,550,062.

[52] U.S. Cl. ....................339/75 MP, 211/26, 339/176 MP

[51] Int. Cl. ....................H01r 13/54

[58] Field of Search ....................339/17, 45, 75, 176; 211/26; 317/101 DH

[56] References Cited

UNITED STATES PATENTS

| | | | |
|---|---|---|---|
| 2,993,187 | 7/1961 | Bisbing et al. | 339/17 LM |
| 3,335,386 | 8/1967 | Upton | 339/17 L |
| 3,245,546 | 4/1966 | Stuhler | 211/41 |

FOREIGN PATENTS OR APPLICATIONS

| | | | |
|---|---|---|---|
| 633,952 | 7/1959 | Italy | 339/45 M |

*Primary Examiner*—Joseph H. McGlynn
*Attorney*—Fred Jacob and Edward W. Hughes

[57] ABSTRACT

This invention relates to mounting of printed wiring boards, and more particularly to a mounting device for mechanically attaching a printed wiring board to a backpanel.

2 Claims, 6 Drawing Figures

INVENTOR

CHARLES E. ESTER

Patented May 23, 1972 3,665,369

2 Sheets-Sheet 2

MOUNTING DEVICE FOR PRINTED WIRING BOARDS

CROSS-REFERENCE TO RELATED APPLICATION

This is a division of application Ser. No. 693,599, filed Dec. 26, 1967, now U.S. Pat. No. 3,550,062.

FIELD OF THE INVENTION

One of the primary objectives in the design of modern electronic equipment is to increase their electronic operating speeds, and since electronic signals travel at approximately 13 inches per nanosecond, the trend is to shorten the distances that the signals must travel.

New manufacturing techniques have reduced the size of individual elements such as resistors, capacitors, diodes and the like. Other technological advances have resulted in the creation of so-called micro-modules and micro-miniature circuits, all in an attempt to decrease the signal travel time within the individual components.

The achievement of high speed operation of electronic equipment depends not only on signal travel time within the components, but also on the distances between the components. The miniaturization of components has not only decreased the signal travel time within the components, it has also permitted higher packaging densities (closer spacing) of the components on the printed wiring boards, thus decreasing signal travel time between components.

The printed wiring boards are mounted on an electrical interconnecting medium referred to as a motherboard or backpanel, and to decrease the signal travel time between the printed wiring boards, they are physically mounted as close together as possible.

The increased packaging densities of modern high speed electronic equipment has created the need for a connector to interconnect the printed wiring board and the backpanel which will aid in increasing the packaging densities.

DESCRIPTION OF THE PRIOR ART

Prior art connectors for interconnecting a printed wiring board and a backpanel, as exemplified by U.S. Pat. No. 3,173,732, comprise elongated insulator blocks having spring contacts retained within transverse grooves or channels formed along the length of the blocks. These spring contacts protrude outwardly from the grooves for electrically connecting the various conductors on the printed wiring board to the backpanel.

The mounting of these prior art connectors to the printed wiring boards is accomplished by screws passing through predrilled holes in the printed wiring board and threading into captive nuts embedded within the insulator block. The attachment of the connector to the backpanel is accomplished in the same manner. The elongated shape of the insulator block requires that a plurality of the captive nuts be utilized at spaced intervals along the length of the block to reduce its warping and bowing and thus hold the spring contacts in conductive contact with the printed wiring board and with the backpanel. These prior art connectors are structurally weak and subject to breakage due to the reduced cross sectional area of the insulative material in the proximity of the embedded nuts. The mounting nuts embedded at spaced intervals along the insulator block of the prior art connectors consume valuable space that would otherwise contain spring contacts, thus imposing a packaging limitation on the printed wiring boards and backpanel assembly by requiring corresponding empty spaces on the wiring boards and backpanel adjacent the captive nuts.

SUMMARY OF THE INVENTION

In accordance with the claimed invention, a mounting device is provided for use with a printed wiring board. An edge connector, provided on the printed wiring board, utilizes a spring contact which yieldingly protrudes from each of a plurality of transverse channels formed along an elongated insulator block. One end of each of the spring contacts is affixed to the printed wiring board, thereby mechanically and electrically uniting the printed wiring board and the connector without employing captive nuts within the insulative block. The mounting device of the present invention is attached to the backpanel and comprises a frame which engages the side edges of the printed wiring board and spring-loads it and the spring contacts of the connector into conductive contact with the backpanel.

It is, therefore, one object of this invention to provide an improved printed wiring board mounting device.

Another object of this invention is to provide an improved printed wiring board mounting device in which a maximum area of the connector is available for spring contact elements.

A further object of this invention is to provide a mounting device which exerts and maintains a constant and even spring contact pressure between a printed wiring board and a backpanel.

A still further object of this invention is to provide an improved printed wiring board mounting device which guides and supports the printed wiring board on the backpanel.

The foregoing and other objects of this invention, the various features thereof as well as the invention itself, may be more fully understood from the following description when read together with the accompanying drawings, in which:

DESCRIPTION OF THE PREFERRED EMBODIMENT

Figure 1:
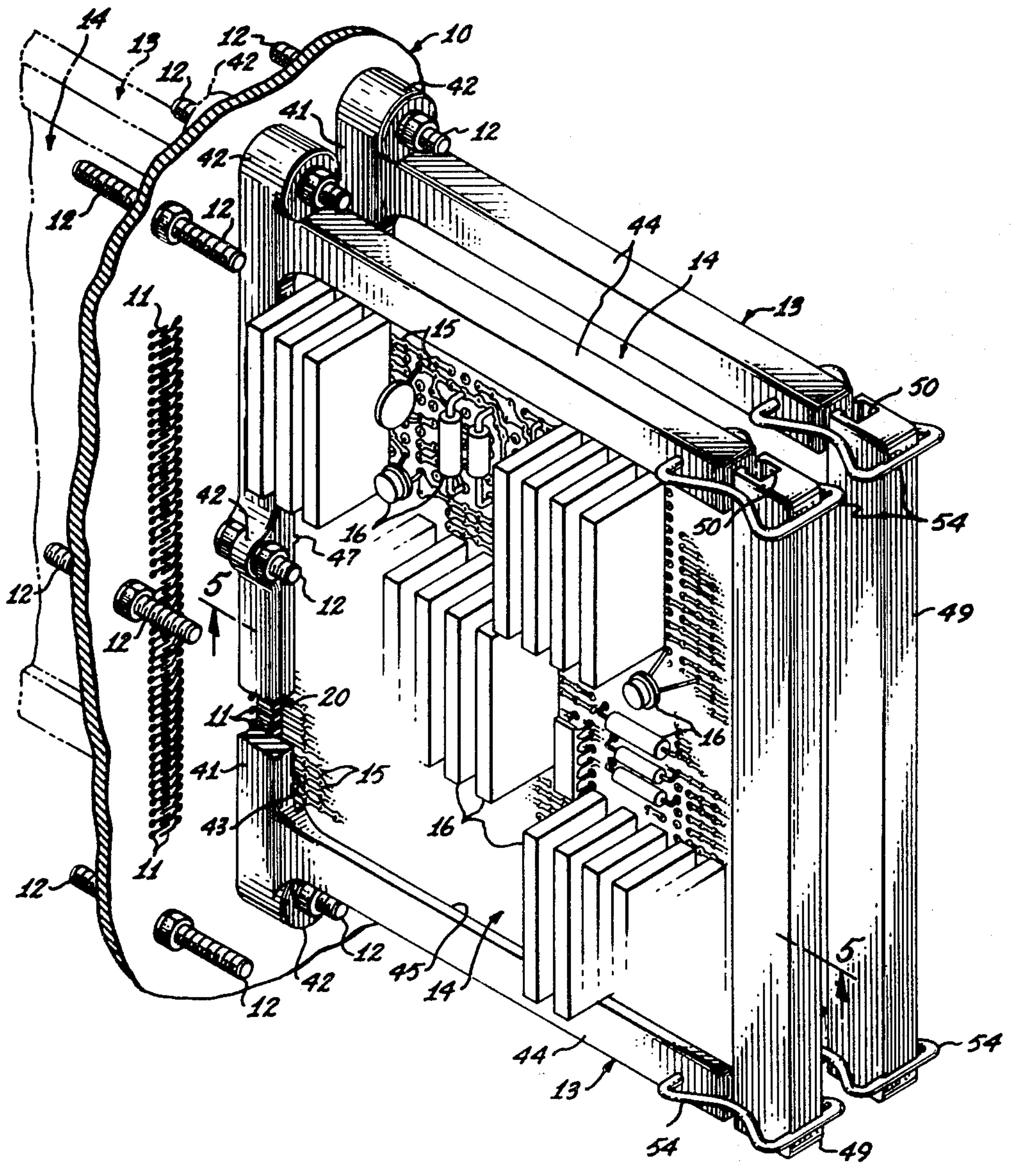
FIG. 1 is a fragmentary perspective view illustrating the features of the present invention.

Referring more particularly to the drawings by characters of reference, FIG. 1 illustrates a fragmentary portion of a backpanel 10 having a plurality of contact terminals 11 and mounting studs 12 arranged thereon and to which is attached a mounting device 13 incorporating features of this invention. The mounting device 13 is adapted to retain a printed wiring board 14 in contact with the backpanel 10.

Figures 2, 3, 4, 5, 6:
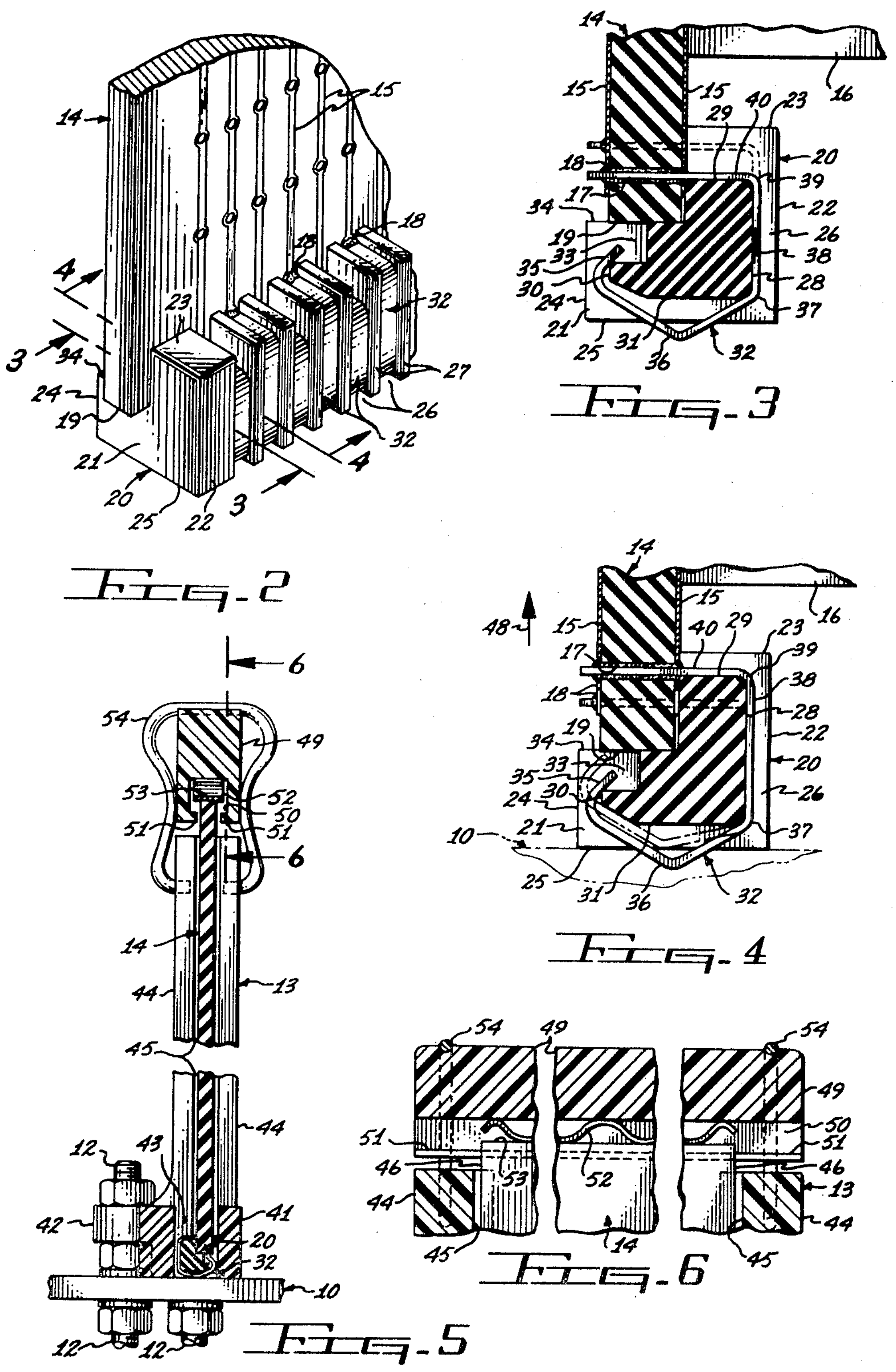
FIG. 2 is a fragmentary perspective view of the printed wiring board and connector.
FIG. 3 is an enlarged fragmentary sectional view taken on the line 3—3 of FIG. 2.
FIG. 4 is an enlarged fragmentary sectional view taken on the line 4—4 of FIG. 2.
FIG. 5 is an enlarged fragmentary sectional view taken on the line 5—5 of FIG. 1.
FIG. 6 is an enlarged fragmentary sectional view taken on the line 6—6 of FIG. 5.

The printed wiring board 14 is provided with wire runs 15 for electrically interconnecting a plurality of components 16 mounted thereon. As shown in FIGS. 3 and 4, each wire run 15 is provided with a hole 17 in its terminal end 18 arranged adjacent an edge 19 of the printed wiring board.

A connector 20 is mounted on edge 19 of the printed wiring board so as to provide electrical continuity between the terminal ends 18 of the printed wiring board 14 and the contact terminals 11 of the backpanel 10 when the printed wiring board 14 is retained within the mounting device 13.

Connector 20, as best seen in FIGS. 2, 3, 4 and 5, comprises an elongated block 21 which is molded or otherwise formed of synthetic resinous compositions having good insulating qualities such as the well-known product sold under the trademark Lexan. This product, when used in molding block 21, may include reinforcing fibers. Block 21 may be of any desired length and is of substantially square cross section with faces 22, 23, 24 and 25 forming its peripheral surfaces. A plurality of channels 26 are cut or otherwise spacedly formed within faces 22, 23, 24 and 25 along the length of block 21 and transversely to its longitudinal axis. The channels are separated by lands 27 which form parts of the faces. Each channel is of sufficient size to receive a spring contact 32. The bottom of each channel is arranged to form a recess 33 extending inwardly toward the center of block 21 in a portion 30 thereof. A notch 34 is formed in faces 23 and 24 longitudinally of block 21 and is adapted to receive edge 19 of the printed wiring board 14.

The spring contact 32 provided in each channel 26 is formed of a strip of resilient material with good conductive properties such as beryllium copper. Each spring contact is performed to provide a hooked end 35 which is turned into and yieldingly retained by recess 33. Each spring contact 32 is provided with a V-shaped contact portion 36 adjacent to its hooked end which is deformed to extend outwardly of surface 25 of block 21. Each contact is bent along its length at area 37 to provide a flat portion 38 which engages with and hugs a part 28 of the bottom of channel 26. Another bend in area 39 of spring contact 32 provides an extended end portion 40 which engages another part 29 of the bottom of channel 26 and projects into notch 34.

When the edge 19 of the printed wiring board 14 is inserted into notch 34 of block 21, ends 40 of spring contacts 32 arranged in each of channels 26 pass through holes 17 in terminal ends 18 of wire runs 15 of the printed wiring board. Soldering or other attaching means secures the ends 40 of the spring contacts within holds 17 to firmly affix connector 20 to the printed wiring board 14 as well as providing electrical continuity between the wire runs 15 and the spring contacts 32.

The mounting of spring contacts 32, as hereinbefore described, biases contact portions 36 outwardly of surface 25 of block 21. As best seen in FIG. 4, when contact portions 36 are depressed from the solid line position to the broken line position, any lost motion of the spring contacts is absorbed by their hooked ends 35 moving within recesses 33 of channels 26.

The printed wiring board 14 with connector 20 affixed thereto is mounted on backpanel 10 by means of the mounting device 13. As best seen in FIGS. 1, 5 and 6, mounting device 13 comprises a base 41 having integrally formed bosses 42 for demountably attaching the mounting device to the studs 12 of backpanel 10. The base 41 is further provided with a longitudinal slot 43 which receives and positions connector 20. At opposite ends of base 41 are spacedly arranged guide arms 44, each provided with an inwardly facing groove 45. The guide arms 44 and their grooves 45 are suitably spaced to receive side edges 46 of the printed wiring board 14 and to slidably guide edges 46 into position within mounting device 13.

The attachment of the mounting device 13 on the backpanel 10 as hereinbefore described, is designed to precisely position the mounting device so that the contact terminals 11 of the backpanel 10 are presented in the longitudinal slot 43 of base 41.

With the printed wiring board 14 positioned within the mounting device 13, and connector 20 inserted within the longitudinal slot 43 of the base 41, the contact portions 36 of spring contacts 32 will be in conductive contact with the terminals 11 of backpanel 10. The precise registration of each spring contact 32 with an aligned conductor terminal 11 is provided by the combination of grooves 45 formed in guide arms 44 which generally guide the printed wiring board 14 and its connector, and by an indexing key 47, FIG. 1, formed within longitudinal slot 43. Key 47 engages a predetermined channel 26 of block 21, from which spring contact 32 has been omitted.

The previously described depressing of spring contacts 32 into channels 26 creates a compression force in contacts 32 which biases the printed wiring board in the direction of arrow 48 shown in FIG. 4, thereby tending to disengage the spring contacts from terminals 11 of backpanel 10. To nullify this biasing force and compensate for other factors such as manufacturing tolerances and temperature variations of the printed wiring board assembly, the mounting device is provided with a biasing retainer cap 49. The retainer cap 49 is of substantially square cross section and defines a channel 50 formed along its length which is provided with inwardly facing ledges 51 along the longitudinal opening of the channel. As best seen in FIGS. 5 and 6, a waveform spring 52 is provided in channel 50 of cap 49, spring 52 being held in a preloaded condition by ledges 51. The retainer cap 49 is positioned and held in place by clips 54 pivotally mounted on the outermost ends of guide arms 44. The outermost edge 53 of printed wiring board 14 will enter channel 50 of cap 49 and engage spring 52 retained therein, thereby exerting a force on the printed wiring board 14 in the clamped position which is greater than, and opposite to, the biasing force of spring contacts 32.

The backpanel 10 is supplied with contact terminals (not shown) on the back surface, which are duplicates of the contact terminals 11 provided on the front surface. The terminals on the back surfaces provide the same electrical connections to the internal circuitry as do terminals 11 on the front surface of the backpanel. The duplicate terminals (not shown) permit the mounting device 13 and printed wiring board 14 to be removed from its normal position shown in solid lines of FIG. 1 and remounted in the broken line position, thus facilitating servicing and debugging of the equipment under normal operating conditions which could not be otherwise accomplished due to the close proximity of the numerous printed wiring boards 14 mounted on the front surface of backpanel 10.

While the principles of the invention have now been made clear in a preferred embodiment, there will be immediately obvious to those skilled in the art many modifications of structure, arrangement, proportions, the elements, materials, and components used in the practice of the invention, and otherwise, which are particularly adapted for specific environments and operating requirements without departing from those principles. The appended claims are therefore intended to cover and embrace any such modifications within the limits only of the true spirit and scope of the invention.

What is claimed is:

1. A mounting device for attaching a printed wiring board to a backpanel, said mounting device comprising:

a. an elongated base;

b. a pair of spacedly arranged guide arms extending from opposite ends of said base, each of said guide arms having an elongated groove formed within its inner facing surface to slidably contain opposite side edges of the printed wiring board; and c. a biasing retainer cap means demountably attached to the outermost ends of said guide arms to engage the outermost edge of the printed wiring board, whereby the printed wiring board is captively held within the mounting device, said bias retainer cap means comprising:

i. an elongated block having a longitudinal channel formed therein, said channel having inwardly facing ledges formed in the longitudinal opening thereof; and ii. an elongated waveform spring arranged within said channel so that said waveform spring is held in a preloaded state by said ledges, whereby penetration of the outermost edge of the printed wiring board into said channel results in a spring force being applied to the printed wiring board.

2. A mounting device for attaching a printed wiring board to a backpanel, the printed wiring board having mounted thereon an edge connector which is adapted for pressurized contact with the backpanel, the mounting device comprising:

a. an elongated base having a longitudinal slot passing therethrough to receive and position the edge connector;

b. fastening means on said base for fastening the mounting device to the backpanel; and c. a pair of spacedly arranged guide arms extending from opposite ends of said base, each of said guide arms having an elongated groove formed within its inner facing surface to slidably contain opposite side edges of the printed wiring board; and d. a biasing retainer cap means demountably coupled to the outermost ends of said guide arms to engage the outer edge of the printed wiring board to bias the printed wiring board into contact with the backpanel, said biasing retainer cap means comprising:

i. an elongated block having a longitudinal channel formed along its length;

ii. a pair of ledges formed on said block and disposed within the longitudinal opening of the channel; and iii. biasing means arranged within the channel and held in a preloaded state by said ledges for applying a biasing force to the printed wiring board when the outer edge thereof enters the channel.

* * * * *